US012392832B2

(12) United States Patent
Hwang et al.

(10) Patent No.: US 12,392,832 B2
(45) Date of Patent: Aug. 19, 2025

(54) APPARATUS AND METHOD FOR EVALUATING BATTERY PERFORMANCE AND EQUIPMENT FOR TRANSPORTING BATTERY (71) Applicant: SK ON CO., LTD., Seoul (KR)

(72) Inventors: Chang Mook Hwang, Daejeon (KR); Na Eun Gil, Daejeon (KR); Hyun Ji Kim, Daejeon (KR); Jong Hyeok Lee, Daejeon (KR); Yoon Ji Jo, Daejeon (KR)

(73) Assignee: SK ON CO., LTD., Seoul (KR)

( * ) Notice: Subject to any disclaimer, the term of this patent is extended or adjusted under 35 U.S.C. 154(b) by 120 days.

(21) Appl. No.: 18/335,564

(22) Filed: Jun. 15, 2023

(65) Prior Publication Data
US 2024/0168096 A1   May 23, 2024

(30) Foreign Application Priority Data

Nov. 17, 2022  (KR) .......................... 10-2022-0154491

(51) Int. Cl.
G01R 31/374 (2019.01)
G01R 31/36 (2020.01)
G01R 31/3835 (2019.01)
G01R 31/392 (2019.01)
H02J 7/00 (2006.01)

(52) U.S. Cl.
CPC ....... *G01R 31/374* (2019.01); *G01R 31/3644* (2013.01); *G01R 31/3835* (2019.01); *G01R 31/392* (2019.01); *H02J 7/0048* (2020.01); *H02J 7/00712* (2020.01)

(58) Field of Classification Search
None
See application file for complete search history.

(56) References Cited

U.S. PATENT DOCUMENTS 9,551,759 B2    1/2017  Yazami et al.
10,511,001 B1*  12/2019 Zhang ................. H01M 10/425
2006/0244458 A1* 11/2006 Cho ........................ B60L 58/12
                                                                   324/426

(Continued)

FOREIGN PATENT DOCUMENTS

JP    2013-190259 A     9/2013
KR    10-2016-0041679 A  4/2016

*Primary Examiner* — Jas A Sanghera
(74) *Attorney, Agent, or Firm* — IP & T GROUP LLP (57) ABSTRACT The present invention provides an apparatus and a method for evaluating performance of a battery and equipment for transporting the battery. The battery performance evaluation apparatus of the present invention includes: a temperature measurement unit for measuring an aging temperature of the battery; a voltage measurement unit for measuring a first open circuit voltage of the battery at the start of aging and measuring a second open circuit voltage of the battery at the end of aging; and a processor for calculating a delta voltage of a voltage drop using a difference between the first open circuit voltage and the second open circuit voltage measured by the voltage measurement unit, and determining normal or defective of the battery based on the delta voltage calculated using the aging temperature measured by the temperature measurement unit and an aging period between measurement times of the first and second open circuit voltage.

15 Claims, 5 Drawing Sheets

(56) References Cited

U.S. PATENT DOCUMENTS

| | | | |
|---|---|---|---|
| 2009/0200987 A1* | 8/2009 | Saito | H01M 10/615 |
| | | | 320/134 |
| 2011/0175571 A1* | 7/2011 | Renken | H02J 7/00714 |
| | | | 320/112 |
| 2016/0149177 A1* | 5/2016 | Sugeno | B60R 16/033 |
| | | | 429/151 |
| 2020/0225290 A1* | 7/2020 | Sylvester | H01M 10/448 |
| 2022/0418137 A1* | 12/2022 | Matsumoto | H05K 7/02 |
| 2024/0044987 A1* | 2/2024 | Kim | G01R 31/3865 |

* cited by examiner

APPARATUS AND METHOD FOR EVALUATING BATTERY PERFORMANCE AND EQUIPMENT FOR TRANSPORTING BATTERY

BACKGROUND OF THE INVENTION

1. Field of the Invention

The present invention relates to an apparatus and a method for evaluating performance of a battery and equipment for transporting the battery, and particularly, to an apparatus and a method for evaluating performance of a battery, which may significantly reduce a risk of defective battery while significantly shortening a formation section of a formation process, and equipment for transporting the battery.

2. Description of the Related Art

As currently commercialized secondary batteries, there are a nickel-cadmium battery, a nickel-hydrogen battery, a nickel-zinc battery, a lithium secondary battery and the like. Among them, the lithium secondary battery becomes a mainstream secondary battery due to advantages such as a freer charging/discharging scheme, very lower self-discharge rate, and higher energy density than the nickel-based secondary battery.

However, the lithium secondary battery also require a formation section of the formation process. Although the formation section differs from company to company depending on their owned techniques, the batteries are left in an unloaded state for about 7 to 30 days, then open circuit voltage drops thereof are measured, and normal or defective products are determined based on the magnitude of the measured voltage drops. The temperature of the corresponding formation section varies from room temperature to 45° C. or 60° C., and the reason for increasing the temperature is to shorten the formation section through formation of the battery.

Meanwhile, it is possible to obtain various advantages such as securing a space for production of the battery and enhancing yield by shortening the period of the formation section, but it is not possible to obtain a sufficient delta voltage of the open circuit voltage drop, which is a criterion for screening the defective products, such that problems may occur in screening the defective product. In particular, a battery for an electric vehicle or energy storage system may cause a fire if the defective product is not properly screened.

SUMMARY OF THE INVENTION

One object of the present invention is to provide an apparatus and a method for evaluating performance of a battery, which may significantly reduce a risk of defective battery while significantly shortening a formation section of a formation process, and equipment for transporting the battery.

However, the problem to be solved by the present invention is not limited to the above-described problems, and may be expanded by those skilled in the art in various ways without departing from the technical spirit and scope of the present invention.

To achieve the above object, according to an aspect of the present invention, there is provided an apparatus for evaluating performance of a battery, the apparatus including: a temperature measurement unit configured to measure an aging temperature of the battery; a voltage measurement unit configured to measure a first open circuit voltage of the battery at the start of aging and measure a second open circuit voltage of the battery at the end of aging; and a processor configured to calculate a delta voltage of a voltage drop using a difference between the first open circuit voltage and the second open circuit voltage measured by the voltage measurement unit, and determine whether the battery is a normal or defective product based on the delta voltage calculated using the aging temperature measured by the temperature measurement unit and an aging period between a measurement time of the first open circuit voltage and a measurement time of the second open circuit voltage.

The temperature measurement unit may periodically measure the temperature of the battery at a predetermined time interval during aging of the battery to output the measured temperature values, and the processor may set a voltage range for comparison with the delta voltage in order to determine whether the battery is a normal or defective product in consideration of the temperature values measured at a predetermined time interval by the temperature measurement unit and the aging period.

The processor may set the voltage range for comparison with the delta voltage as a reference voltage and a deviation from the reference voltage.

The processor may set the reference voltage higher as the aging temperature of the battery is increased and the aging period is increased, and may set the deviation greater as the aging temperature is increased.

The apparatus may further include a charging/discharging unit configured to charge and discharge the battery, wherein the processor may calculate a rated capacity of the battery by controlling the charging/discharging unit and the voltage measurement unit.

The processor may control the charging/discharging unit to charge the battery to a value desired by a client or 75% of state of charge after calculating the rated capacity of the battery.

In addition, according to another aspect of the present invention, there is provided equipment for transporting a battery, the equipment including: the above-described apparatus for evaluating performance of a battery; and a tray box in which the battery is loaded, wherein the tray box includes a heating unit configured to increase the temperature of the battery and a cooling unit configured to decrease the temperature of the battery.

The heating unit may include a hot wire configured to heat the battery, and the cooling unit may include a Peltier element configured to cool the battery.

The processor may control the heating unit and the cooling unit to maintain the temperature of the battery in consideration of a shipping duration of the battery in the equipment for transporting a battery.

A first open circuit voltage of the battery loaded in the tray box may be a voltage at a time when the battery is determined to be a normal product in a formation process.

The tray box may further include a spring for close contact of the battery when the battery is loaded in the tray box and a rubber product for protecting electrodes of the battery.

Further, to achieve the above object, according to another aspect of the present invention, there is provided a method for evaluating performance of a battery in an apparatus for evaluating performance of a battery, the method including: measuring a first open circuit voltage of the battery at the start of aging; measuring an aging temperature of the battery; measuring a second open circuit voltage of the battery at the end of aging; calculating a delta voltage of a voltage drop using a difference between the first open circuit voltage measured in the step of measuring the first open circuit voltage and the second open circuit voltage measured in the step of measuring the second open circuit voltage; and determining whether the battery is a normal or defective product based on the delta voltage using the aging temperature measured in the step of measuring the aging temperature and an aging period between a measurement time of the first open circuit voltage and a measurement time of the second open circuit voltage.

According to various embodiments of the present invention, an aging process for inspecting defects of a battery, which is a part of the formation process, may be performed during a delivery or storage process after shipment, such that manufacturing time and costs of the battery can be reduced.

In addition, according to various embodiments of the present invention, the voltage range to be used for determining whether a battery is defective may be set by considering the aging temperature and aging period, such that it is possible to determine whether the battery is defective with high accuracy even if the aging temperature and aging period are variable.

Further, according to various embodiments of the present invention, the rated capacity may be measured and provided at the time of delivering the battery to a client company, such that screening of normal or defective products for capacity can be freed from the storage period and shipping duration.

Furthermore, according to various embodiments of the present invention, since charging or discharging to a desired state of charge (SOC) is performed at the time of delivering the battery to the client company, problems caused by the SOC deviation that may occur in the battery pack for an electric vehicle, an energy storage system, and the like can be resolved.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Hereinafter, embodiments will be described in detail with reference to the accompanying drawings. In denoting reference numerals to components of respective drawings, it should be noted that the same components will be denoted by the same reference numerals although they are illustrated in different drawings. Further, in description of preferred embodiments of the present invention, the publicly known functions and configurations related to the present invention, which are verified to be able to make the purport of the present invention unnecessarily obscure will not be described in detail.

Meanwhile, in respective steps, each of the steps may occur differently from the specified order unless a specific order is clearly described in the context. That is, each of the steps may be performed in the same order as the specified order, may be performed substantially simultaneously, or may be performed in the reverse order.

Further, wordings to be described below are defined in consideration of the functions in the present invention, and may differ depending on the intentions of a user or an operator or custom. Accordingly, such wordings should be defined on the basis of the contents of the overall specification.

It will be understood that, although the terms first, second, etc. may be used herein to describe various components, but these components should not be limited by these terms. These terms are used only to distinguish one component from other components. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

In addition, a division of the configuration units in the present disclosure is intended for ease of description and divided only by the main function set for each configuration unit. That is, two or more of the configuration units to be described below may be combined into a single configuration unit or formed by two or more of divisions by function into more than a single configuration unit. Further, each of the configuration units to be described below may additionally perform a part or all of the functions among functions set for other configuration units other than being responsible for the main function, and a part of the functions among the main functions set for each of the configuration units may be exclusively taken and certainly performed by other configuration units.

Figure 1:
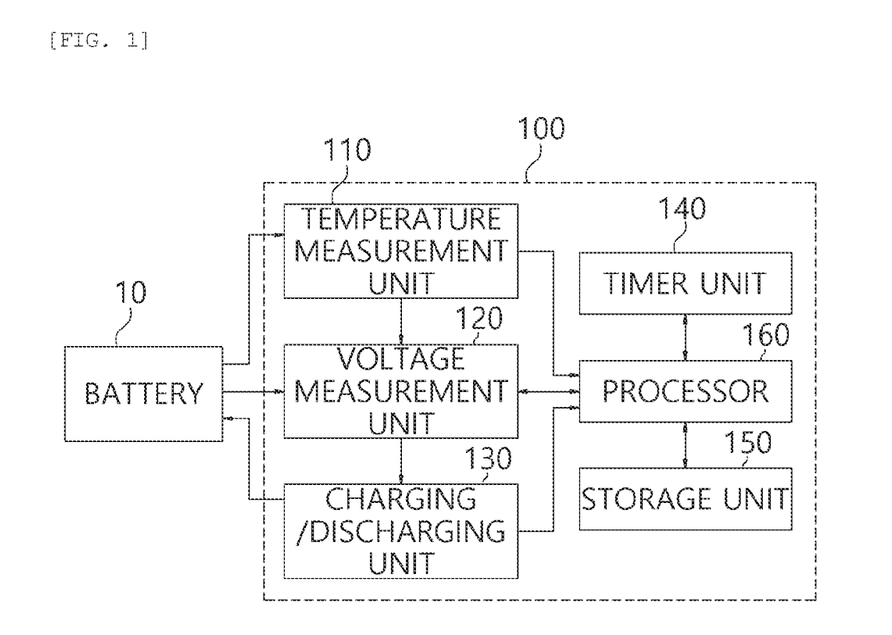
FIG. 1 is a block diagram illustrating an apparatus for evaluating performance of a battery according to an embodiment of the present disclosure.

FIG. 1 is a block diagram illustrating an apparatus for evaluating performance of a battery according to an embodiment of the present disclosure.

As shown in FIG. 1, an apparatus for evaluating performance of a battery ('battery performance evaluation apparatus) 100 includes a temperature measurement unit 110, a voltage measurement unit 120, a charging/discharging unit 130, a timer unit 140, a storage unit 150 and a processor 160.

The temperature measurement unit 110 is configured to measure a temperature of a battery 10. The temperature measurement unit 110 particularly measures an aging temperature of the battery 10, and specifically, may measure the temperature of the battery 10 at a predetermined time interval during aging of the battery 10 to output the measured temperature values.

The voltage measurement unit 120 is configured to measure an open circuit voltage (OCV) of the battery 10 in a no-load state. The voltage measurement unit 120 may measure a first open circuit voltage when the battery 10 is loaded in the battery performance evaluation apparatus 100, and may finally measure a second open circuit voltage of the battery 10 in the no-load state. That is, the voltage measurement unit 120 may measure the open circuit voltages at the start of aging and at the end of aging. Here, the end of aging may include immediately before and after end of aging. The voltage measurement unit 120 may also measure a voltage of the battery 10 in relation to a rated capacity of the battery 10 and a battery state of charge (SOC).

The charging/discharging unit 130 is configured to charge and discharge the battery 10 under the control of the processor 160. If it is determined that the battery 10 is a normal product, the processor 160 may measure the rated capacity of the battery 10 while charging and discharging the battery 10 by controlling the charging/discharging unit 130. For example, the processor 160 may measure the rated capacity of the battery by charging the battery 10 that has been determined to be normal to SOC 100% through the charging/discharging unit 130 and then discharging the battery to SOC 10% again.

le;.4qThe timer unit 140 is a watch configured to inform the time. The storage unit 150 may be configured to store programs or commands for operation of the battery performance evaluation apparatus 100 and store data measured and processed by the battery performance evaluation apparatus 100. For example, the storage unit 150 may store the temperature of the battery 10 measured by the temperature measurement unit 110, the first open circuit voltage and second open circuit voltage of the battery measured by the voltage measurement unit 120, and the measurement time of the first open circuit voltage and the measurement time of the second open circuit voltage, which are read from the timer unit 140.

The processor 160 is configured to calculate a delta voltage of the voltage drop using a difference between the first open circuit voltage and the second open circuit voltage measured by the voltage measurement unit 120. The processor 160 is also configured to determine whether the battery 10 is a normal or defective product based on the delta voltage calculated using the aging temperature measured by the temperature measurement unit 110 and an aging period between a measurement time of the first open circuit voltage and a measurement time of the second open circuit voltage.

The processor 160 may also store the temperature values measured by the voltage measurement unit 120 in the storage unit 150 every time set at a predetermined interval, and may differently set a voltage range for comparison with the delta voltage in order to determine whether the battery 10 is a normal or defective product in consideration of the measured temperature values and the aging period between the measurement time of the first open circuit voltage and the measurement time of the second open circuit voltage, which are stored in the storage unit 150. The processor 160 may set the voltage range as a reference voltage and a deviation from the reference voltage.

Since a degree to which self-discharge occurs varies depending on the aging temperature and the aging period described in Table 1 below, the voltage range for comparison with the delta voltage may be differently set according to these conditions. For the convenience, the SOC of the battery 10 was maintained at 75%.

TABLE 1

| No. | Aging temperature (° C.) | Aging period (days) | Delta voltage |
| --- | --- | --- | --- |
| 1 | 25 | 30 | 25 ± 5 mV |
| 2 | 25 | 60 | 40 ± 5 mV |
| 3 | 25 | 90 | 50 ± 5 mV |
| 4 | 35 | 30 | 30 ± 7 mV |
| 5 | 35 | 60 | 50 ± 7 mV |
| 6 | 35 | 90 | 60 ± 7 mV |
| 7 | 45 | 30 | 38 ± 9 mV |
| 8 | 45 | 60 | 47 ± 9 mV |
| 9 | 45 | 90 | 57 ± 9 mV |
| 10 | 55 | 30 | 45 ± 11 mV |
| 11 | 55 | 60 | 63 ± 11 mV |
| 12 | 55 | 90 | 71 ± 11 mV |
| 13 | 65 | 30 | 50 ± 14 mV |
| 14 | 65 | 60 | 68 ± 14 mV |
| 15 | 65 | 90 | 76 ± 14 mV |

In Table 1, if the aging temperature is 25° C. and the aging period is 30 days, the delta voltage of the normal product is within about ±5 mV based on 25 mV, and if the aging temperature is 35° C. and the aging period is 30 days, the delta voltage of the normal product is within about ±7 mV based on 35 mV. Accordingly, the delta voltage of the normal product has a deviation of about ±5 mV to ±14 mV, and this deviation becomes greater when the aging temperature is increased.

As a result, the reference voltage for the delta voltage varies depending on the aging temperature and the aging period. The higher the aging temperature and the longer the aging period, the greater the reference voltage. Meanwhile, in the case of the deviation from the reference voltage, it is preferable to increase the deviation as the aging temperature is increased.

As shown in Table 1, the processor 160 may differently set the reference voltage for comparison with the delta voltage and the deviation using the temperature values measured by the temperature measurement unit 110 and the aging period in order to determine whether the battery 10 is a normal or defective product. In this case, rather than considering all temperature values, an average value of temperature may be obtained for a predetermined period, for example, every day, and the obtained average value may be used.

The processor 160 controls the charging/discharging unit 130 and the voltage measurement unit 120 to calculate the rated capacity of the battery 10, and may control the charging/discharging unit 130 so as to charge or discharge the battery 10 to a value desired by the client or 75% of the SOC after calculating the rated capacity of the battery 10.

Figure 2:
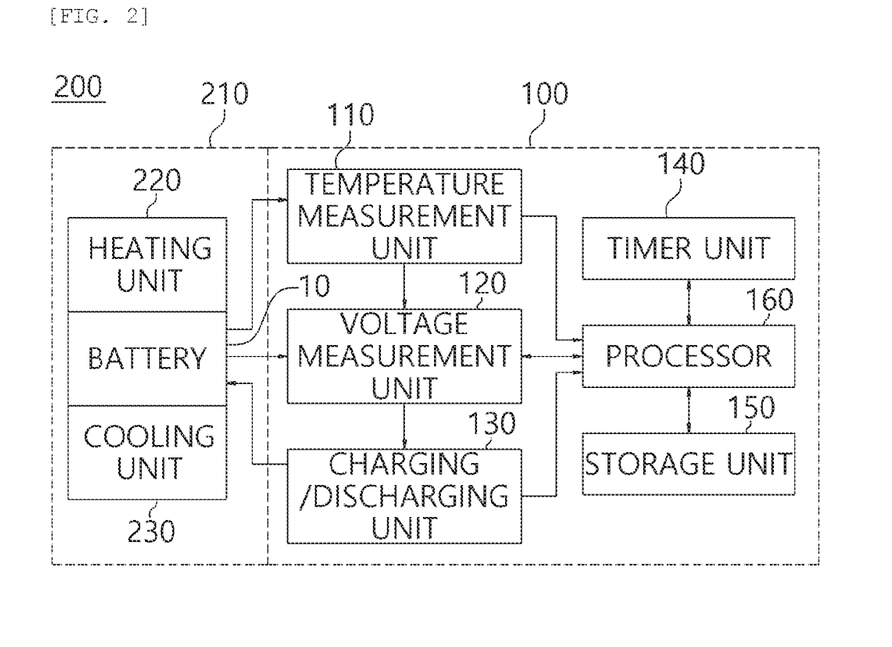
FIG. 2 is a block diagram illustrating equipment for transporting a battery according to another embodiment of the present disclosure.
Figure 3:
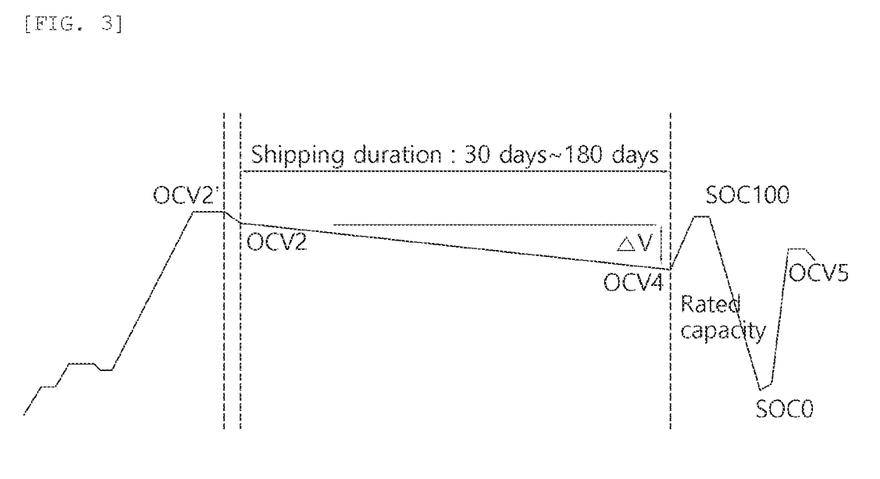
FIG. 3 is a diagram describing a procedure for determining whether a battery is a normal or defective product and charging to a battery state of charge in the equipment for transporting a battery shown in FIG. 2.

FIG. 2 is a block diagram illustrating equipment for transporting a battery according to another embodiment of the present disclosure, and FIG. 3 is a diagram describing a procedure for determining whether a battery is a normal or defective product and charging to a battery state of charge in the battery transport equipment shown in FIG. 2.

As shown in FIG. 2, equipment for transporting a battery ('battery transport equipment') 200 may include a battery performance evaluation apparatus 100 and a tray box 210. The battery performance evaluation apparatus 100 may include a temperature measurement unit 110, a voltage measurement unit 120, a charging/discharging unit 130, a timer unit 140, a storage unit 150 and a processor 160, and the tray box 210, in which the battery 10 is loaded, may include a heating unit 220 and a cooling unit 230. Here, it is necessary to clearly understand that the battery performance evaluation apparatus 100 and the tray box 210 are only classifications for overall description, and that the battery performance evaluation apparatus 100 may be embedded in the tray box 210.

The temperature measurement unit 110 measures a temperature of the battery 10. The temperature measurement unit 110 particularly measures an aging temperature of the battery 10, and specifically, may measure the temperature of the battery at a predetermined time interval during aging of the battery to output the measured temperature values.

The voltage measurement unit 120 measures an open circuit voltage (OCV) of the battery 10 in a no-load state. The voltage measurement unit 120 measures a first open circuit voltage when the battery 10 is loaded in the battery performance evaluation apparatus 100, and finally measures a second open circuit voltage of the battery 10 in the no-load state. The voltage measurement unit 120 may also measure a voltage of the battery in relation to the rated capacity of the battery 10 and the battery SOC.

The charging/discharging unit 130 charges and discharges the battery 10 under the control of the processor 160. The timer unit 140 is a watch which informs the time. The storage unit 150 stores the temperature of the battery 10 measured by the temperature measurement unit 110, the first open circuit voltage and second open circuit voltage of the battery 10 measured by the voltage measurement unit 120, and the measurement time of the first open circuit voltage and the measurement time of the second open circuit voltage, which are read from the timer unit 140.

The processor 160 calculates a delta voltage of the voltage drop using a difference between the first open circuit voltage and the second open circuit voltage measured by the voltage measurement unit 120. The processor 160 also determines whether the battery 10 is a normal or defective product based on the delta voltage calculated using the aging temperature measured by the temperature measurement unit 110 and the aging period between the measurement time of the first open circuit voltage and the measurement time of the second open circuit voltage.

The processor 160 may also store the temperature values measured by the voltage measurement unit 120 in the storage unit 150 every time set at a predetermined interval, and may differently set a voltage range for comparison with the delta voltage and a deviation from the reference voltage in order to determine whether the battery 10 is a normal or defective product in consideration of the measured temperature values and the aging period between the measurement time of the first open circuit voltage and the measurement time of the second open circuit voltage, which are stored in the storage unit 150.

The processor 160 may calculate the reference voltage for comparison with the delta voltage and the deviation using the temperature values measured by the temperature measurement unit 110 and the aging period in order to determine whether the battery 10 is a normal or defective product. In this case, rather than considering all temperature values, an average value of temperature may be obtained for a predetermined period, for example, every day, and the obtained average value may be used.

As described above, the tray box 210, in which the battery is loaded, may include the heating unit 220 and the cooling unit 230.

The heating unit 220 is configured to increase the temperature of the battery 10. The heating unit 220 may include a hot wire to increase the temperature of the battery 10. The cooling unit 230 is configured to decrease the temperature of the battery 10. The cooling unit 230 may include a Peltier element to decrease the temperature of the battery 10.

Here, referring to Table 1 again, when the aging period of the battery 10, that is, a shipping duration including shipment of the battery transport equipment 200 is determined, the aging temperature may be adjusted by controlling the heating unit 220 and the cooling unit 230 in order to increase detection reliability according to the shipping duration. Therefore, the processor 160 may control the heating unit 220 and the cooling unit 230 to maintain the temperature of the battery 10 constant in consideration of the shipping duration of the battery 10 in the battery transport equipment 200.

Meanwhile, a defect detection time and a power consumption amount may vary depending on the maintenance temperature and temperature range described in Table 2 below.

TABLE 2

| No. | External temperature (° C.) | Maintenance temperature (° C.) | Detailed condition | Required power (60 days) | Minimum defect detection time (days) |
|---|---|---|---|---|---|
| 1 | 23 | 25 | Cooling with Peltier element at 26° C., and heating with hot wire at 24° C. | 17.28 kWh | 43 |
| 2 | 23 | 25 | Cooling with Peltier element at 28° C., and heating with hot wire at 22° C. | 5.76 kWh | 46 |
| 3 | 40 | 25 | Cooling with Peltier element at 26° C., and heating with hot wire at 24° C. | 51.84 kWh | 43 |
| 4 | 40 | 25 | Cooling with Peltier element at 28° C., and heating with hot wire at 22° C. | 17.28 kWh | 46 |
| 5 | 23 | 35 | Cooling with Peltier element at 36° C., and heating with hot wire at 34° C. | 34.56 kWh | 33 |
| 6 | 23 | 35 | Cooling with Peltier element at 38° C., and heating with hot wire at 32° C. | 11.52 kWh | 35 |
| 7 | 23 | 45 | Cooling with Peltier element at 46° C., and heating with hot wire at 44° C. | 51.84 kWh | 25 |

TABLE 2-continued

| No. | External temperature (° C.) | Maintenance temperature (° C.) | Detailed condition | Required power (60 days) | Minimum defect detection time (days) |
|---|---|---|---|---|---|
| 8 | 23 | 45 | Cooling with Peltier element at 48° C., and heating with hot wire at 42° C. | 17.28 kWh | 26 |

The batteries 10 in Table 2 were manufactured by inserting metal foreign matters therein, and assuming a problem during manufacturing, an iron (Fe) foreign matter having a central value of 10 μm as a foreign matter was inserted into the battery 10. In order to verify each effect, the environments, that is, the external temperatures, were prepared for two cases of 23° C. and 40° C., and the inventor looked at how the performance of the battery varies while maintaining the temperatures to 25° C., 35° C. or 45° C., respectively, using the Peltier element and the hot wire under these environments. For the convenience, the SOC of the battery 10 was maintained at 75%, which generally belongs to the high detectability range in shipping SOC.

Further, in Nos. 1, 3, 5 and 7 of the battery 10, the temperature range of the battery 10 was set and maintained at ±1° C. to maximize the effect, and in Nos. 2, 4, 6 and 8 of the battery 10, the temperature range of the battery 10 was set and maintained at ±3° C. to confirm whether the power used can be minimized.

Referring to Table 2, Nos. 1 and 2 of the battery 10, in which the external temperature is set to be 23° C. and the maintenance temperature is set to be 25° C., have a minimum defect detection time of 43 days and 46 days, respectively, and Nos. 3 and 4 of the battery 10, in which the external temperature is set to be 40° C. and the maintenance temperature is set to be 25° C., also have a minimum defect detection time of 43 days and 46 days, respectively. Thereby, it can be seen that the external temperature of the battery 10 has no effect on the detection of defects, but power consumption is increased as the difference between the external temperature and the maintenance temperature is increased.

Therefore, when supplying the battery 10 abroad, it is preferable for the processor 160 to control the heating unit 220 and the cooling unit 230 to match the maintenance temperature close to the external temperature by minimizing the amount of power used from the viewpoint of deterioration. In addition, when the shipping duration is short, it is preferable to increase the maintenance temperature because it is necessary to detect a defect of the battery 10 in a short period of time. However, in the case of the maintenance temperature, problems may occur if it exceeds 60° C. from the viewpoint of decomposition and deterioration of the electrolyte, such that it is preferable that the temperature does not exceed 50° C.

Meanwhile, procedures for determining whether a battery is a normal or defective product and charging to a battery state of charge in the battery transport equipment shown in FIG. 2 is illustrated in FIG. 3.

First, an initial open circuit voltage (OCV2') may be measured using a separate open circuit voltage measurement device during a formation section of the formation process. In addition, a first open circuit voltage (OCV2) may be measured by the separate open circuit voltage measurement device, or the like for a predetermined period, for example, in a 20% section of a formation process. A separate processor 160, or the like may obtain a delta voltage by subtracting the first open circuit voltage from the initial open circuit voltage, and then determine a defect first.

The processor 160 may control the voltage measurement unit 120 to measure the first open circuit voltage (OCV2) of the battery 10 loaded in the tray box 210. In addition, the processor 160 may control the heating unit 220 and the cooling unit 230 by setting the maintenance temperature inside the tray box 210 according to the shipping duration. The battery 10 loaded in the tray box 210 may be stored for a long period of time at a constant temperature. However, there may be a situation where electricity cannot be supplied from an outside to the battery 10 loaded in the tray box 210. Therefore, the inventive equipment does not necessarily have to include the heating unit 220 and the cooling unit 230. However, since maintaining a constant level of the temperature is more effective in screening the defective product, it is preferable to include the heating unit 220 and the cooling unit 230.

The processor 160 may control the voltage measurement unit 120 to measure a second open circuit voltage (OCV4) at the time of completing the shipment of the battery 10. The processor 160 may obtain a delta voltage (ΔV) by subtracting the second open circuit voltage from the first open circuit voltage. Here, the delta voltage (ΔV) may be variable according to the maintenance temperature and the aging period.

Meanwhile, the battery transport equipment 200 may charge the battery to a value of SOC (OCV5), which is desired by the client company, in addition to the purpose of screening only the normal or defective product. When requested by the client company, the processor 160 may control the charging/discharging unit 130 to charge the battery 10 that has been determined to the normal product to SOC 100% (SOC100) and then discharge the battery 10 to SOC 0% (SOC0), and may calculate the rated capacity of the battery 10 using the time required to reach SOC 10% capacity. Then, the processor 160 may recharge the battery up to the shipping SOC. In this case, if there is no request from the client company, the SOC may be maintained at 75%.

Figure 4A:
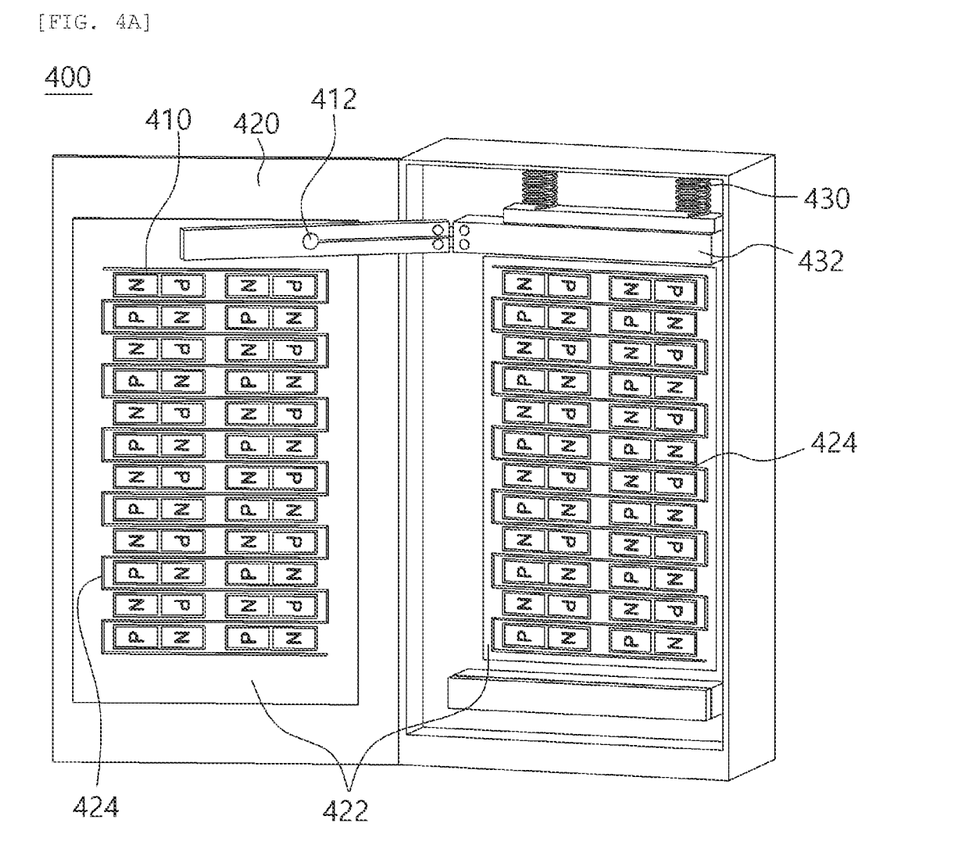
FIGS. 4A and 4B are views illustrating a specific configuration of the equipment for transporting a battery shown in FIG. 2.
Figure 4B:
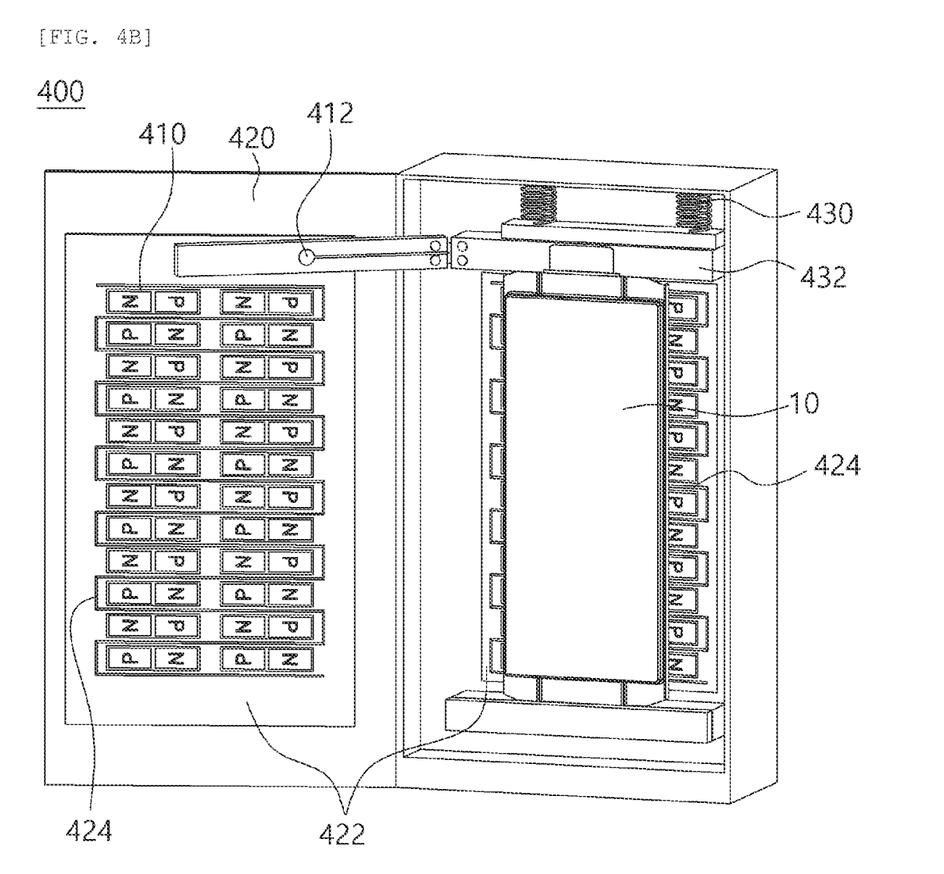

FIGS. 4A and 4B are views illustrating a specific configuration of the battery transport equipment shown in FIG. 2.

As shown in FIGS. 4A and 4B, the tray box 210 may include a temperature sensing line 410 for detecting a temperature of the battery, and a voltage detection line 412 for detecting a voltage of the battery. The voltage sensing line 412 may be provided on a tray cover 420 and connected to electrodes of the battery 10 in a hinged manner. The tray cover 420, which is the front of the tray box 210, and the rear surface of the tray box 210 are provided with a Peltier module 422 and a hot wire 424, respectively. The Peltier module 422 may be formed in a plate shape, and may include Peltier elements connected in series therein.

The tray box 210 may further include a spring 430 for close contact of the battery 10 to safely transport and a rubber product 432 for protecting current terminals and the electrodes of the battery 10.

Figure 5:
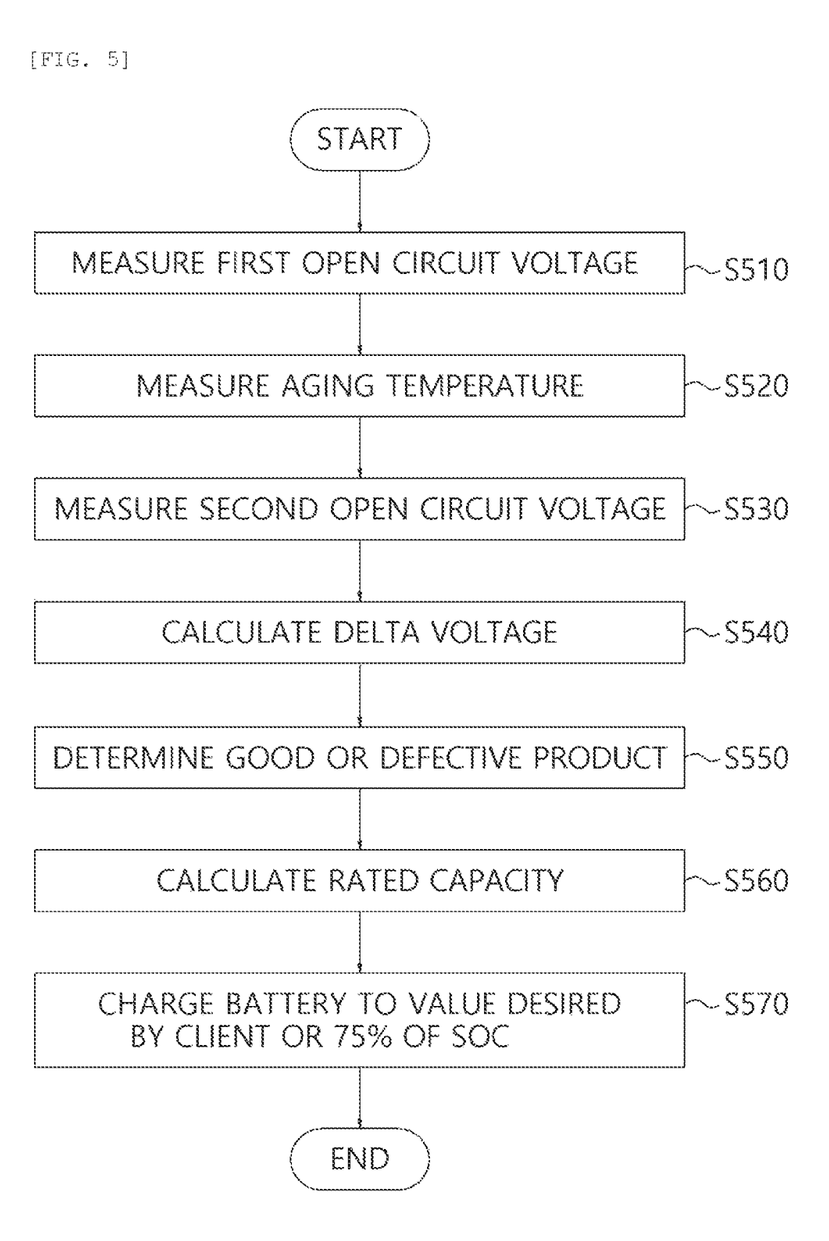
FIG. 5 is a flowchart illustrating procedures of a method for evaluating performance of a battery according to another embodiment of the present disclosure.

FIG. 5 is a flowchart illustrating procedures of a method for evaluating performance of a battery according to another embodiment of the present disclosure.

The processor 160 measures a first open circuit voltage of the battery 10 through the voltage measurement unit 120 at the start of aging (S510). The processor 160 may store the first open circuit voltage measured by the voltage measurement unit 120 in the storage unit 150, and may also store the measurement time of the first open circuit voltage of the battery 10 using the timer unit 140 in the storage unit 150.

The processor 160 measures an aging temperature of the battery 10 through the temperature measurement unit 110 (S520). Specifically, the processor 16 may control the temperature measurement unit 110 to measure the temperature of the battery 10 at a predetermined time interval using the timer unit 140 during aging of the battery 10, and may receive temperature values from the temperature measurement unit 110. The processor 160 may store the temperature values input from the temperature measurement unit 110 in the storage unit 150.

The processor 160 measures a second open circuit voltage of the battery 10 through the voltage measurement unit 120 at the end of aging (S530). The processor 160 may store the second open circuit voltage measured by the voltage measurement unit 120 in the storage unit 150, and may also store the measurement time of the second open circuit voltage of the battery 10 using the timer unit 140 in the storage unit 150.

The processor 160 calculates a delta voltage of the voltage drop using a difference between the first open circuit voltage and the second open circuit voltage measured by the voltage measurement unit 120 (S540).

The processor 160 may determine whether the battery 10 is a normal or defective product based on the delta voltage calculated using the aging temperature measured by the temperature measurement unit 110 and the aging period between the measurement time of the first open circuit voltage and the measurement time of the second open circuit voltage (S550). The processor 160 may differently set the voltage range for comparison with the delta voltage in order to determine whether the battery 10 is a normal or defective product in consideration of the measured temperature values and the aging period between the measurement time of the first open circuit voltage and the measurement time of the second open circuit voltage, which are stored in the storage unit 150. The processor 160 may set the voltage range as a reference voltage and a deviation from the reference voltage.

The processor 160 controls the charging/discharging unit 130 and the voltage measurement unit 120 to calculate a rated capacity of the battery 10 (S560). If it is determined that the battery 10 is a normal product, the processor 160 may measure the rated capacity of the battery 10 through charging and discharging operations. For example, the processor 160 may measure the rated capacity of the battery by charging the battery 10 that has been determined to be normal to SOC 100% through the charging/discharging unit 130 and then discharging the battery to SOC 10%.

After calculating the rated capacity of the battery 10, the processor 160 controls the charging/discharging unit 130 and the voltage measurement unit 120 to charge the battery 10 to a value desired by the client or 75% of the SOC (S570).

The battery performance evaluation apparatus described in this disclosure may be an apparatus intended to carry out an aging process for inspecting defects of the battery performed during the formation process in the course of delivery or storage after shipment. For example, the battery performance evaluation apparatus may be implemented in the form of a tray box for storing one or more batteries in the course of delivery or storage, or may be implemented as a separate apparatus and mounted in the tray box.

The apparatus described above may be implemented by hardware components, software components, and/or a combination of hardware components and software components. For example, the apparatus and components described in the embodiments may be implemented in one or more general-use computers or special-purpose computers, such as a processor, a controller, an arithmetic logic unit (ALU), a digital signal processor (DSP), a microcomputer, a field programmable array (FPA), a programmable logic unit (PLU), a microprocessor or any device which may execute instructions and respond. A processing unit may implement an operating system (OS) or one or software applications running on the OS. Further, the processing unit may access, store, manipulate, process and generate data in response to execution of software. It will be understood by those skilled in the art that although a single processing unit may be illustrated for the convenience of understanding, the processing unit may include a plurality of processing elements and/or a plurality of types of processing elements. For example, the processing unit may include a plurality of processors or one processor and one controller. Also, the processing unit may have a different processing configuration, such as a parallel processor.

Software may include computer programs, codes, instructions or one or more combinations thereof and configure a processing unit to operate in a desired manner or independently or collectively control the processing unit. Software and/or data may be permanently or temporarily embodied in any type of machine, components, physical equipment, virtual equipment, computer storage media or units or transmitted signal waves so as to be interpreted by the processing unit or to provide instructions or data to the processing unit. Software may be dispersed throughout computer systems connected via networks and be stored or executed in a dispersion manner. Software and data may be recorded in one or more computer-readable storage media.

The method according to the embodiments may be recorded in computer-readable media including program instructions to implement various operations embodied by means of a computer. The computer-readable media may also include, alone or in combination with the program instructions, data files, data structures and the like. The program instructions recorded in the media may be designed and configured specially for the embodiments or be known and available to those skilled in computer software. Examples of computer-readable media include magnetic media such as hard disks, floppy disks, and magnetic tape; optical media such as CD ROMs and DVDs; magneto-optical media such as floptical disks; and hardware devices that are specially configured to store and perform program instructions, such as read-only memory (ROM), random access memory (RAM), flash memory and the like. Examples of program instructions include both machine code, such as produced by a compiler, and files containing higher level code that may be executed by the computer using an interpreter. The hardware devices may be configured to act as one or more software modules to perform the operations of the embodiments, or vice versa.

As described above, although the embodiments have been illustrated and described with reference to the limited embodiments and the accompanying drawings, it will be apparent to those skilled in the art that various modifications and alternations may be possible from the above descriptions. For example, adequate effects may be achieved even if the foregoing processes and methods are carried out in different order than described above, and/or the above-described elements, such as systems, structures, devices, or circuits, are combined or coupled in different forms and modes than as described above or be substituted or switched with other components or equivalents. Therefore, other implements, other embodiments, and equivalents to claims are within the scope of claims to be describe below.

What is claimed is:

1. An apparatus for evaluating performance of a battery, the apparatus comprising:
    a temperature measurement unit configured to measure an aging temperature of the battery;
    a voltage measurement unit configured to measure a first open circuit voltage of the battery at the start of aging and measure a second open circuit voltage of the battery at the end of aging; and
    a processor configured to calculate a delta voltage of a voltage drop using a difference between the first open circuit voltage and the second open circuit voltage measured by the voltage measurement unit, and determine whether the battery is a normal or defective product based on the delta voltage calculated using the aging temperature measured by the temperature measurement unit and an aging period between a measurement time of the first open circuit voltage and a measurement time of the second open circuit voltage,
    wherein the temperature measurement unit periodically measures the temperature of the battery at a predetermined time interval during aging of the battery to output the measured temperature values, and
    the processor sets a voltage range for comparison with the delta voltage in order to determine whether the battery is a normal or defective product in consideration of the temperature values measured at a predetermined time interval by the temperature measurement unit and the aging period.

2. The apparatus according to claim 1, wherein the processor sets the voltage range for comparison with the delta voltage as a reference voltage and a deviation from the reference voltage.

3. The apparatus according to claim 2, wherein the processor sets the reference voltage higher as the aging temperature of the battery is increased and the aging period is increased, and sets the deviation greater as the aging temperature is increased.

4. The apparatus according to claim 1, further comprising a charging/discharging unit configured to charge and discharge the battery,
    wherein the processor calculates a rated capacity of the battery by controlling the charging/discharging unit and the voltage measurement unit.

5. The apparatus according to claim 4, wherein the processor controls the charging/discharging unit to charge the battery to a value desired by a client or 75% of state of charge after calculating the rated capacity of the battery.

6. Equipment for transporting a battery, the equipment comprising:
    the apparatus for evaluating performance of a battery according to claim 1; and
    a tray box in which the battery is loaded,
    wherein the tray box includes a heating unit configured to increase the temperature of the battery and a cooling unit configured to decrease the temperature of the battery.

7. The equipment according to claim 6, wherein the heating unit includes a hot wire configured to heat the battery, and
    the cooling unit comprises a Peltier element configured to cool the battery.

8. The equipment according to claim 6, wherein the processor controls the heating unit and the cooling unit to maintain the temperature of the battery in consideration of a shipping duration of the battery in the equipment for transporting a battery.

9. The equipment according to claim 6, wherein a first open circuit voltage of the battery loaded in the tray box is a voltage at a time when the battery is determined to be a normal product in a formation process.

10. The equipment according to claim 6, wherein the tray box further comprises a spring for close contact of the battery when the battery is loaded in the tray box and a rubber product for protecting electrodes of the battery.

11. A method for evaluating performance of a battery in an apparatus for evaluating performance of a battery, the method comprising:
    measuring a first open circuit voltage of the battery at the start of aging;
    measuring an aging temperature of the battery;
    measuring a second open circuit voltage of the battery at the end of aging;
    calculating a delta voltage of a voltage drop using a difference between the first open circuit voltage measured in the step of measuring the first open circuit voltage and the second open circuit voltage measured in the step of measuring the second open circuit voltage; and
    determining whether the battery is a normal or defective product based on the delta voltage using the aging temperature measured in the step of measuring the aging temperature and an aging period between a measurement time of the first open circuit voltage and a measurement time of the second open circuit voltage,
    wherein the step of measuring the aging temperature comprises periodically measuring the temperature of the battery at a predetermined time interval during aging of the battery to output the measured temperature values; and
    the step of determining whether the battery is a normal or defective product comprises setting a voltage range for comparison with the delta voltage in order to determine whether the battery is a normal or defective product in consideration of the temperature values measured at a predetermined time interval in the step of measuring the aging temperature and the aging period.

12. The method according to claim 11, wherein the step of determining whether the battery is a normal or defective product comprises setting the voltage range for comparison with the delta voltage as a reference voltage and a deviation from the reference voltage.

13. The method according to claim 12, wherein the step of determining whether the product is normal or defective comprises setting the reference voltage higher as the aging temperature of the battery is increased and the aging period is increased, and setting the deviation greater as the aging temperature is increased.

14. The method according to claim 11, further comprising calculating a rated capacity of the battery through charging and discharging of the battery.

15. The method according to claim 14, further comprising charging the battery to a value desired by a client or 75% of state of charge after calculating the rated capacity of the battery.

* * * * *